(12) United States Patent
Hamabe

(10) Patent No.: US 11,223,121 B2
(45) Date of Patent: Jan. 11, 2022

(54) ANTENNA DEVICE

(71) Applicant: Panasonic Intellectual Property Management Co., Ltd., Osaka (JP)

(72) Inventor: Taichi Hamabe, Kanagawa (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/912,924

(22) Filed: Jun. 26, 2020

(65) Prior Publication Data

US 2020/0328507 A1 Oct. 15, 2020

Related U.S. Application Data

(63) Continuation of application No. PCT/JP2018/048583, filed on Dec. 28, 2018.

(30) Foreign Application Priority Data

Dec. 28, 2017 (JP) .............................. JP2017-253890

(51) Int. Cl.
*H01Q 1/38* (2006.01)
*H01Q 13/18* (2006.01)

(52) U.S. Cl.
CPC ............... *H01Q 1/38* (2013.01); *H01Q 13/18* (2013.01)

(58) Field of Classification Search
CPC ...... H01Q 1/38; H01Q 13/18; H01Q 15/0086; H01Q 1/521; H01Q 21/24; H05K 9/00
See application file for complete search history.

(56) References Cited

U.S. PATENT DOCUMENTS

| 2002/0175862 | A1* | 11/2002 | Hunter | H01Q 1/521 343/700 MS |
|---|---|---|---|---|
| 2009/0160726 | A1 | 6/2009 | Peng | |
| 2010/0103052 | A1* | 4/2010 | Ying | H01Q 1/38 343/702 |
| 2017/0201023 | A1 | 7/2017 | Chiu et al. | |
| 2018/0351631 | A1 | 12/2018 | Hamabe et al. | |

FOREIGN PATENT DOCUMENTS

| CN | 102197534 | 9/2011 |
|---|---|---|
| CN | 106961001 | 7/2017 |
| CN | 206806483 | 12/2017 |

(Continued)

OTHER PUBLICATIONS

Office Action dated Dec. 25, 2020 in corresponding Chinese Patent Application No. 201880084401.6, with English Translation.

(Continued)

*Primary Examiner* — David E Lotter
(74) *Attorney, Agent, or Firm* — Wenderoth, Lind & Ponack L.L.P.

(57) ABSTRACT

An antenna device having a shape of a polyhedron, includes a plurality of surface members that form surfaces of the polyhedron, and each of which having at least an antenna conductor, an insulating layer, and a shield layer are laminated from an upper layer side, and a frame body that has conductivity, fixes edge portions along sides of adjacent surface members inside the polyhedron, and has a joining member having an intersecting two-surface portion that conducts with the shield layer.

4 Claims, 11 Drawing Sheets

(56) References Cited

FOREIGN PATENT DOCUMENTS

| | | |
|---|---|---|
| JP | 11-353427 | 12/1999 |
| JP | 2001-332929 | 11/2001 |
| JP | 2002-330026 | 11/2002 |
| JP | 2007-027902 | 2/2007 |
| WO | 2010/035528 | 4/2010 |
| WO | 2014/086315 | 6/2014 |
| WO | 2017/134715 | 8/2017 |

OTHER PUBLICATIONS

International Search Report dated Jan. 29, 2019 in International (PCT) Application No. PCT/JP2018/048583 with English translation.

* cited by examiner

ANTENNA DEVICE

BACKGROUND OF THE INVENTION

1. Field of the Invention

The present invention relates to an antenna device.

2. Description of the Related Art

As an antenna device in related art, for example, WO 2017/134715 discloses a radio wave measurement device in which an antenna conductor is directly arranged on a surface of a housing. In this radio wave measurement device, the antenna conductors are similarly provided on the respective surfaces of the housing.

SUMMARY

The present disclosure provides an antenna device capable of preventing an adverse effect that may occur in transmission and reception of a radio wave by an antenna element on other surfaces due to a radio wave entering from a joint between surfaces of a housing, the housing being formed in a hexahedron by a plurality of surfaces on which antenna elements are respectively arranged.

The present disclosure provides an antenna device having a shape of a polyhedron, the antenna device including a plurality of surface members that form surfaces of the polyhedron and each of having at least an antenna conductor and a shield layer are laminated via an insulating layer from an upper layer side; and a frame body that has conductivity, fixes edge portions along sides of adjacent surface members inside the polyhedron, and has a joining member having an intersecting two-surface portion that conducts with the shield layer.

According to the present disclosure, it is possible to prevent an adverse effect that may occur in transmission and reception of a radio wave by an antenna element on other surfaces due to a radio wave entering from a joint between surfaces of a housing, the housing being formed in a hexahedron by a plurality of surfaces on which antenna elements are respectively arranged.

DETAILED DESCRIPTION OF THE EXEMPLARY EMBODIMENTS

Background to Contents of Present Embodiment

For example, in the antenna device described in WO 2017/134715, a laminated substrate in which an antenna conductor and a ground are provided via a dielectric substrate such as glass epoxy is arranged on each of a plurality of surfaces of a housing formed in a hexahedron. The housing is configured by joining surface members to respective surfaces of the hexahedron. For this reason, in the housing, a discontinuous portion of the ground (in other words, the shield) occurs at a joint (in other words, a joint portion) between adjacent surface members. Therefore, in the antenna device of related art, there is a problem that a radio wave entering from the discontinuous portion is diffused inside the housing and adversely affects transmission and reception of a radio wave by an antenna element on other surfaces.

Therefore, in the following embodiment, there is described an example of an antenna device capable of preventing an adverse effect that may occur in transmission and reception of a radio wave by an antenna element on other surfaces due to a radio wave entering from a joint between surfaces of a housing, the housing being formed in a hexahedron by a plurality of surfaces on which antenna elements are respectively arranged.

Hereinafter, the embodiment (hereinafter, referred to as "the present embodiment") that specifically discloses the antenna device according to the present disclosure will be described in detail with reference to the drawings as appropriate. However, unnecessarily detailed descriptions may be omitted. For example, a detailed description of a well-known matter or a repeated description of substantially the same configuration may be omitted. This is to prevent the following description from being unnecessarily redundant and to facilitate understanding of those skilled in the art. The accompanying drawings and the following description are provided for those skilled in the art to facilitate thorough understanding of the present disclosure, and are not intended to limit the claimed subject matters.

Figure 1:
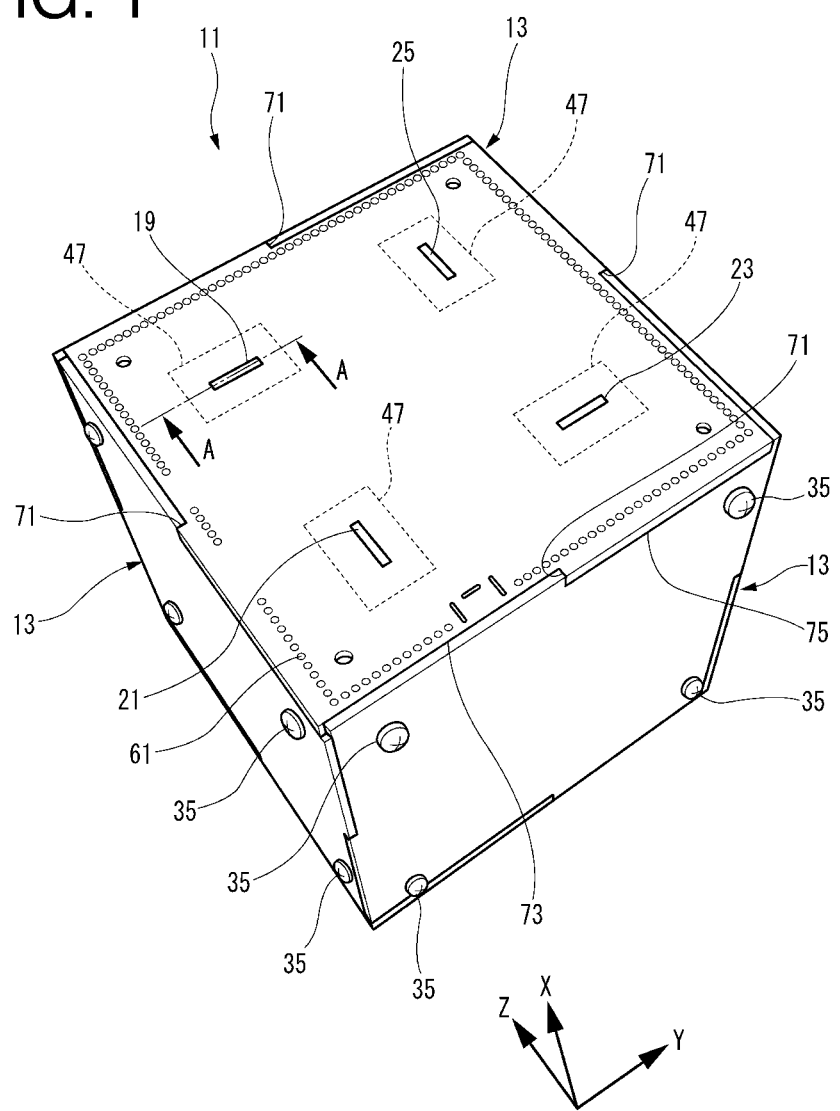
FIG. 1 is a perspective view showing an appearance of an antenna device according to the present embodiment.

FIG. 1 is a perspective view showing an appearance of an antenna device 11 according to the present embodiment. In the present embodiment, directions of an X axis, a Y axis, and a Z axis follow the directions of arrows shown in FIG. 1, for example. For example, the +X direction and the −X direction corresponds to an upper-lower direction of a housing of the antenna device 11, the −Y direction and the +Y direction corresponds to a left-right direction of the housing of the antenna device 11, and the −Z direction and the +Z direction corresponds to a front-rear direction of the housing of the antenna device 11.

Figure 3:
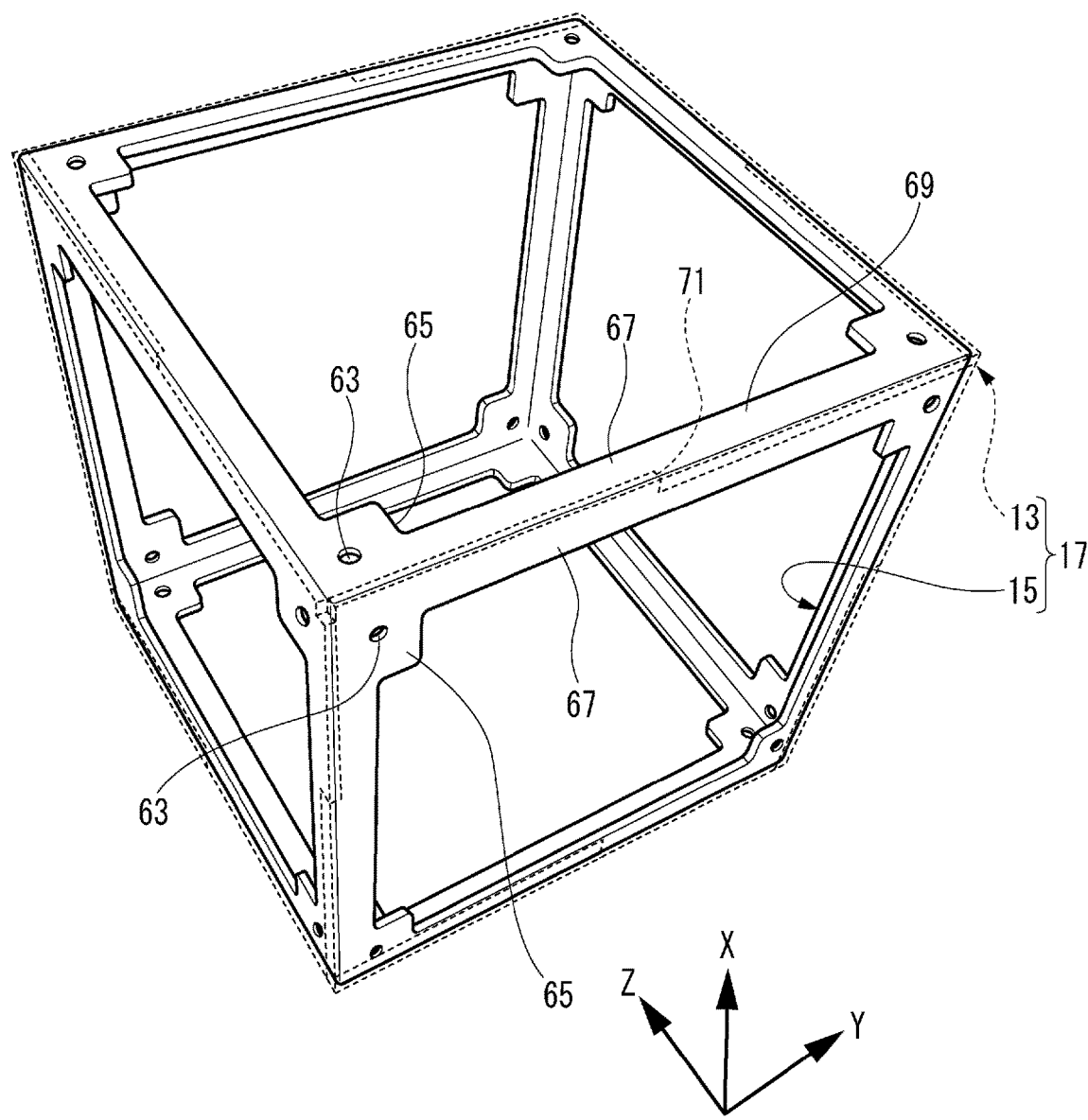
FIG. 3 is a perspective view of a frame body that fixes each surface member of FIG. 1 shown by broken lines.

The antenna device 11 according to the present embodiment has, as main components, laminated substrates 13 as an example of surface members, and a frame body 15 (see FIG. 3). The laminated substrates 13 as an example of the surface members and the frame body 15 form a housing 17 of the antenna device 11, which has a shape of a polyhedron (for example, a hexahedron).

In the present embodiment, a case where the housing of the antenna device 11 is a hexahedron, particularly a cube is described as an example.

The surface members forming the housing of the antenna device 11 are not limited to the laminated substrates 13. The polyhedron is not limited to a hexahedron, but may be a tetrahedron, a dodecahedron or the like.

In the antenna device 11, antennas (to be described later) are provided on a laminated substrate 13 disposed on one upper surface, laminated substrates 13 disposed on each of four side surfaces, and a laminated substrate 13 disposed on one lower surface. As a result, the antenna device 11 can receive incoming radio waves from a total of six directions. When the antenna device 11 is fixed to a predetermined mounting surface to measure a radio wave, the laminated substrate 13 having an antenna may be omitted on the lower surface of the antenna device 11.

The antenna arranged on each of the laminated substrates 13 (an example of the surface members) is, for example, a dipole antenna. The dipole antenna is formed, for example, on each of the laminated substrates 13, and a pattern of the dipole antenna is formed by etching a metal foil on the surface. Each of the plurality of layers is made of, for example, copper foil or glass epoxy.

For example, a 2.4 GHz band horizontal polarization antenna 19, a 2.4 GHz band vertical polarization antenna 21, a 5 GHz band horizontal polarization antenna 23, and a 5 GHz band vertical polarization antenna 25 are provided on surfaces (upper layers) of respective laminated substrates 13 of the cubic housing of the antenna device 11.

Figure 2:
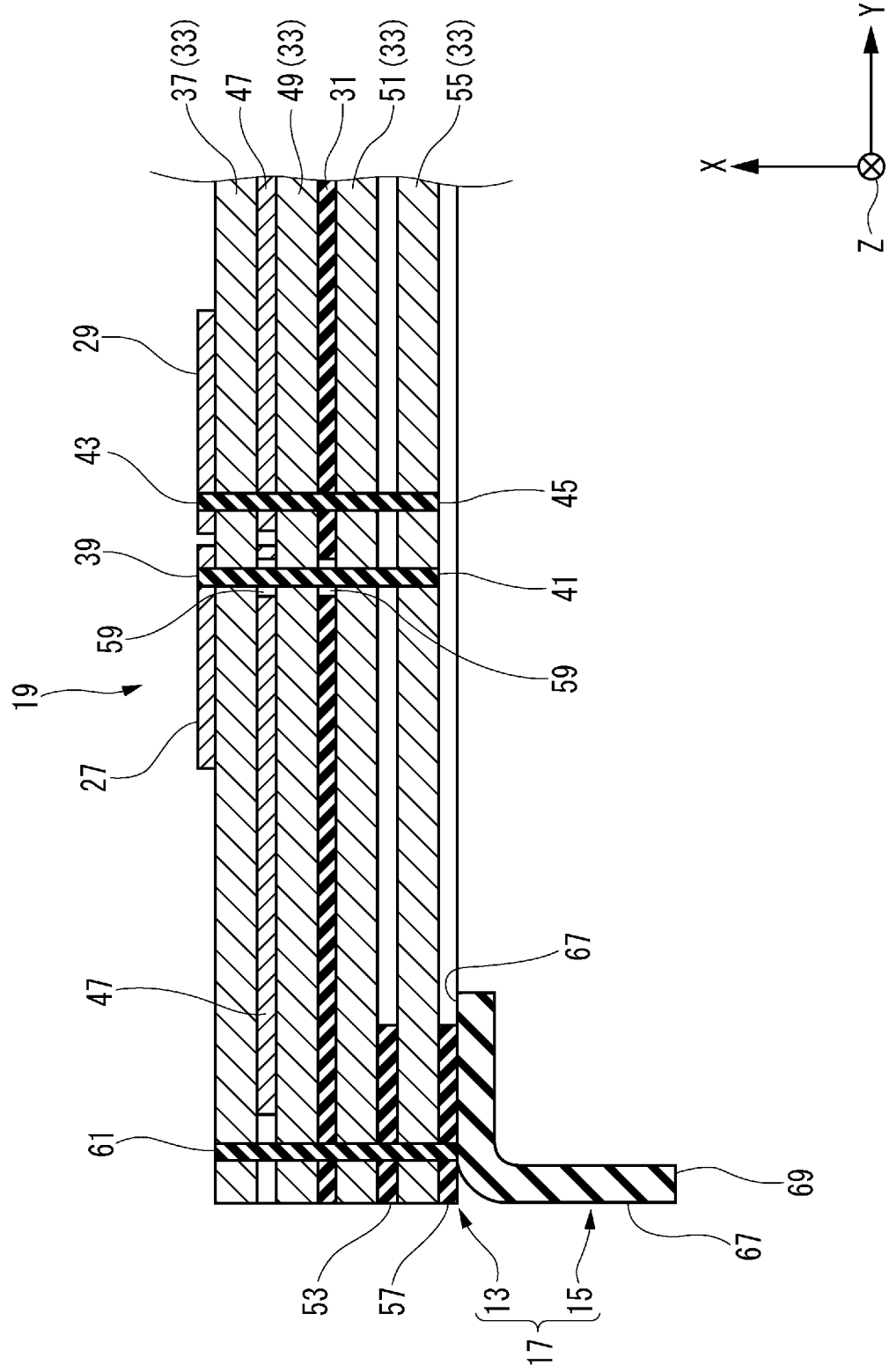
FIG. 2 is a sectional view taken along a line A-A of FIG. 1.

FIG. 2 is a sectional view taken along a line A-A of FIG. 1. The internal structure of the antenna of the antenna device 11 according to the present embodiment will be described by exemplifying the 2.4 GHz band horizontal polarization antenna 19 shown in FIG. 2, for example. The internal structure is the same for the 2.4 GHz band vertical polarization antenna 21, the 5 GHz band horizontal polarization antenna 23, and the 5 GHz band vertical polarization antenna 25.

In each of the laminated substrates 13, at least an antenna conductor (for example, a feeding antenna conductor 27 and a non-feeding antenna conductor 29), a derivative substrate 33 as an example of an insulating layer, and a ground conductor 31 as an example of a shield layer for blocking the entry of radio waves from the outside of the antenna device 11 are laminated from the upper layer side. The laminated substrate 13 is attached to each surface of the cube by, for example, fixing screws 35 (see FIG. 1).

As shown in FIG. 2, the internal structure of the antenna includes at least a dielectric substrate 37, the feeding antenna conductor 27, the non-feeding antenna conductor 29, a via conductor 41 configuring a power supply conductor of a power supply line between a power supply point 39 of the feeding antenna conductor 27 and a wireless communication circuit (not shown: on the lower surface of the laminated substrate 13 (mounted on the lower surface of the dielectric substrate 55 in FIG. 2), and the same applies hereinafter), and a via conductor 45 configuring a ground conductor of a power supply line between a power supply point 43 of the non-feeding antenna conductor 29 and the wireless communication circuit (see above);

Each of the feeding antenna conductor 27 and the non-feeding antenna conductor 29 configures, for example, a dipole antenna. The feeding antenna conductor 27 and the non-feeding antenna conductor 29 are formed such that longitudinal directions thereof extend in the +Y direction and the −Y direction on a straight line, and an end portion of the feeding antenna conductor 27 on the power supply point 39 side and an end portion of the non-feeding antenna conductor 29 on the power supply point 43 side are separated by a predetermined interval.

The via conductors 41 and 45 are formed in a thickness direction from the upper surface to the lower surface of the laminated substrate 13, and are formed by filling respective vias (that is, through holes) with a conductor. The feeding antenna conductor 27 functions as a feeding antenna, and is connected through the via conductor 41 to a feed terminal of the wireless communication circuit (see above) provided on the lower surface of the laminated substrate 13. The non-feeding antenna conductor 29 functions as a non-feeding antenna, and is connected through the via conductor 45 to a feed terminal of the wireless communication circuit (see above) provided on the ground conductor 31 of the laminated substrate 13.

The laminated substrate 13 is formed by sequentially laminating, from the lower surface side to the upper surface side, the ground conductor 57, the dielectric substrate 55, the ground conductor 53, the dielectric substrate 51, the ground conductor 31, the dielectric substrate 49, an AMC 47, and the dielectric substrate 37 on which the feeding antenna conductor 27 and the non-feeding antenna conductor 29 are formed. Here, the dielectric substrates 37, 49, 51, and 55 are formed of a dielectric (in other words, an insulator) such as glass epoxy.

The AMC 47 is an artificial magnetic conductor having perfect magnetic conductor (PMC) characteristics, and is formed by a predetermined metal pattern. By using the AMC 47, the antenna can be arranged in parallel with the laminated substrate 13, and the overall size can be reduced. The AMC 47 can be prevented from receiving radio waves from other directions by the ground conductor 31, and the gain of the antenna can be increased.

The via conductor 41 has, for example, a cylindrical shape, and serves as a power supply line that supplies power for driving the feeding antenna conductor 27 as an antenna. The via conductor 41 is arranged coaxially in a non-contact manner at the center of a via conductor insulating hole 59 so as to electrically connect the feeding antenna conductor 27 formed on the upper surface of the laminated substrate 13 to the feed terminal of the wireless communication circuit (see above), but not to electrically connect with the AMC 47 and the ground conductor 31. That is, a diameter of the via conductor 41 is smaller than a diameter of the via conductor insulating hole 59.

On the other hand, the via conductor 45 also has a cylindrical shape, for example, is for electrically connecting the non-feeding antenna conductor 29 to a ground terminal of the wireless communication circuit (see above), and is electrically connected to the AMC 47 and the ground conductor 31.

In the antenna device 11, a plurality of grounding via conductors 61 are provided on four edge portions of the laminated substrate 13 along each side in a straight line. The grounding via conductors 61 may be arranged at equal intervals. The grounding via conductors 61 may be provided with a sufficient pitch (interval) according to a frequency band (in other words, a wavelength) corresponding to the antenna conductor arranged on the laminated substrate 13 to shield radio waves from outside the antenna device 11. The grounding via conductor 61 is provided so as to penetrate from the upper surface to the lower surface of the laminated substrate 13. The grounding via conductor 61 penetrating the laminated substrate 13 is electrically connected to the ground conductor 31, the ground conductor 53, and the ground conductor 57.

In the laminated structure of the laminated substrate 13 shown in FIG. 2, the dielectric substrate 55 having the ground conductor 53 and the ground conductor 57 around the upper and lower surfaces can be omitted. In this case, the ground conductor 57 may be formed on the lower surface of the dielectric substrate 51. That is, the laminated substrate 13 may be provided with the frame-shaped ground conductor 57 around the lower surface.

FIG. 3 is a perspective view of the frame body 15 that fixes each surface member of FIG. 1 shown by broken lines. In each of the laminated substrates 13, the ground conductor 57 (see FIG. 2) is electrically connected to a joining member of the frame body 15. Further, the laminated substrate 13 is fixed to the frame body 15 by screwing the fixing screws 35 passing through fixing holes 63 formed at four corners into fixing pieces 65 provided at the four corners of the frame body 15.

The frame body 15 has conductivity, and fixes edge portions along each side of adjacent laminated substrates 13 inside the cube. Further, the frame body 15 conducts the edge portions along the respective sides of the laminated substrates 13. That is, the fixing and conduction of each of the laminated substrates 13 can be performed by the joining member (an angle member 69) of the frame body 15 having an intersecting two-surface portion (for example, a orthogonal two-surface portion 67), and shield layers (for example, the ground conductors 31) of the laminated substrates 13 (see FIG. 11).

In the antenna device 11, the laminated substrate 13 is formed in, for example, a quadrangle shape. In the laminated substrate 13, a concave portion 73 and a convex portion 75 are formed in each side portion in a direction along the side portion with one step portion 71 provided at the center of the side portion as a boundary between the concave portion 73 and the convex portion 75. That is, as shown in FIGS. 1 and 2, the cube is assembled by fitting the concave portions 73 and the convex portions 75 of adjacent laminated substrates 13 together.

Figure 4:
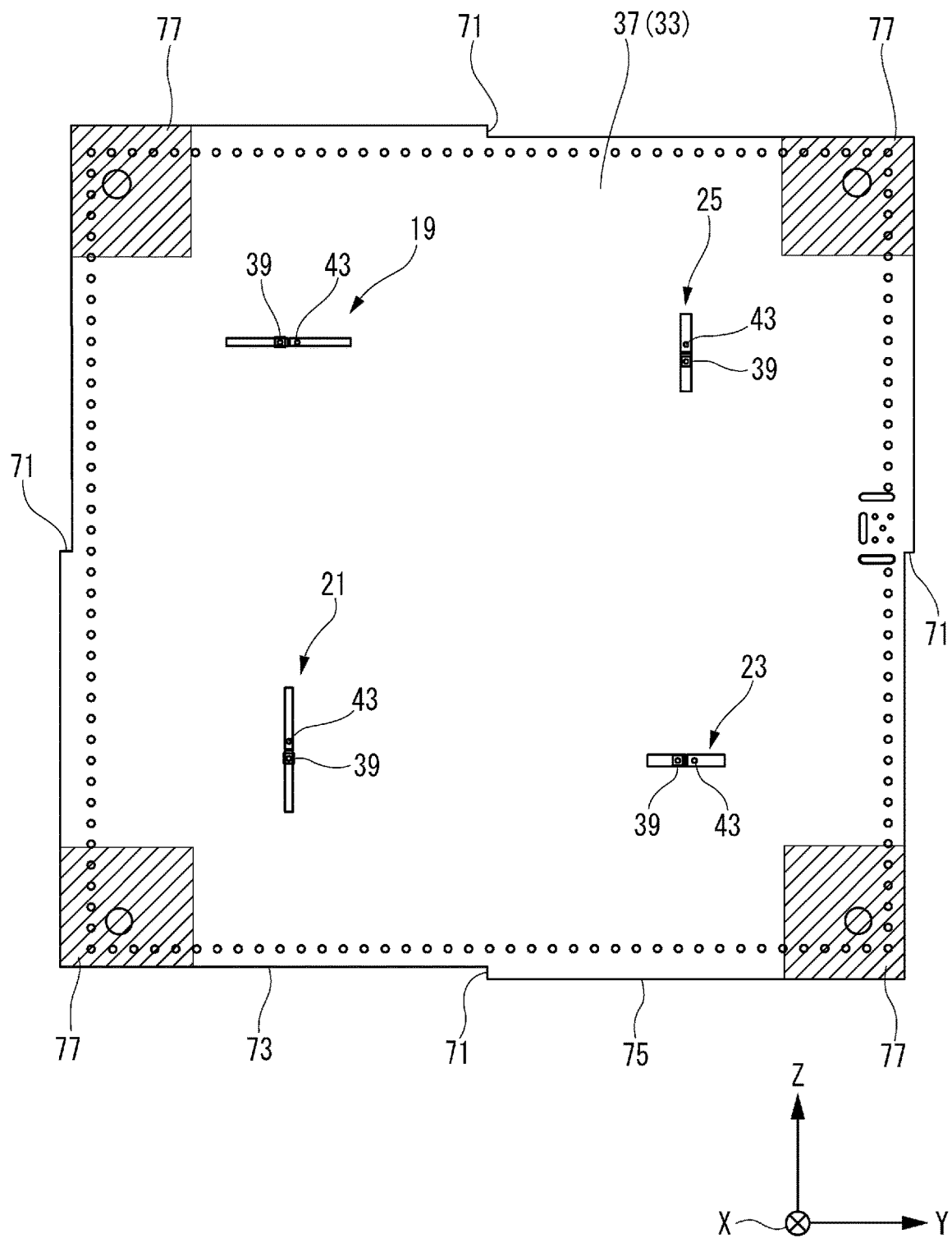
FIG. 4 is a plan view showing an antenna conductor together with a dielectric substrate.

FIG. 4 is a plan view showing the antenna conductor together with the dielectric substrate 37. The size (area) of the dielectric substrate 37 shown in FIGS. 2 and 4, the dielectric substrate 49 shown in FIGS. 2 and 5, the ground conductor 31 shown in FIGS. 2 and 6, and the dielectric substrate 55 shown in FIGS. 2 and 7 are the same. Further, FIG. 4, FIG. 5, FIG. 6 and FIG. 7 are shown in order from the upper surface to the lower surface of the laminated substrate 13 so as to correspond to the internal structure (sectional structure) of the antenna shown in FIG. 2.

Corner ground conductors 77 are formed at four corners on the dielectric substrate 37 on which the horizontal polarization antenna 19, the vertical polarization antenna 21, the horizontal polarization antenna 23, and the vertical polarization antenna 25 are provided. When the plurality of laminated substrates 13 forming a cube are arranged so as to accommodate the frame body 15 inward, the fixing holes 63 of the frame body 15 shown in FIG. 3 are arranged corresponding to the corner ground conductors 77. The corner ground conductor 77 is conducted to the frame body 15 by the fixing screw 35 being screwed into the fixing hole 63. The corner ground conductor 77 is similarly provided on each of the dielectric substrates 49 and 51.

In FIG. 4, a parasitic conductor may be arranged in the vicinity of the antenna conductors of the horizontal polarization antenna 19, the vertical polarization antenna 21, the horizontal polarization antenna 23, and the vertical polarization antenna 25 with a predetermined distance from each other on the dielectric substrate 37. The predetermined distance is, for example, within a quarter of a wavelength of a received radio wave. The parasitic conductor is arranged on one side surface of the antenna conductor in parallel with the Y direction or the Z direction in which the antenna conductors are arranged. Since the parasitic conductor is electrostatically coupled to the AMC 47 similarly to the antenna conductor, it is possible to increase the capacitance between the antenna conductor and the AMC 47 and shift the frequency to a lower side. The parasitic conductor is electrically separated from the antenna conductor.

The size, shape, number or the like of the parasitic conductor is not particularly limited, and the parasitic conductor is not necessarily arranged directly on the AMC 47 as long as the parasitic conductor is on the same side as the antenna when viewed from the AMC 47, and electrostatically coupled to the AMC 47.

Figure 5:
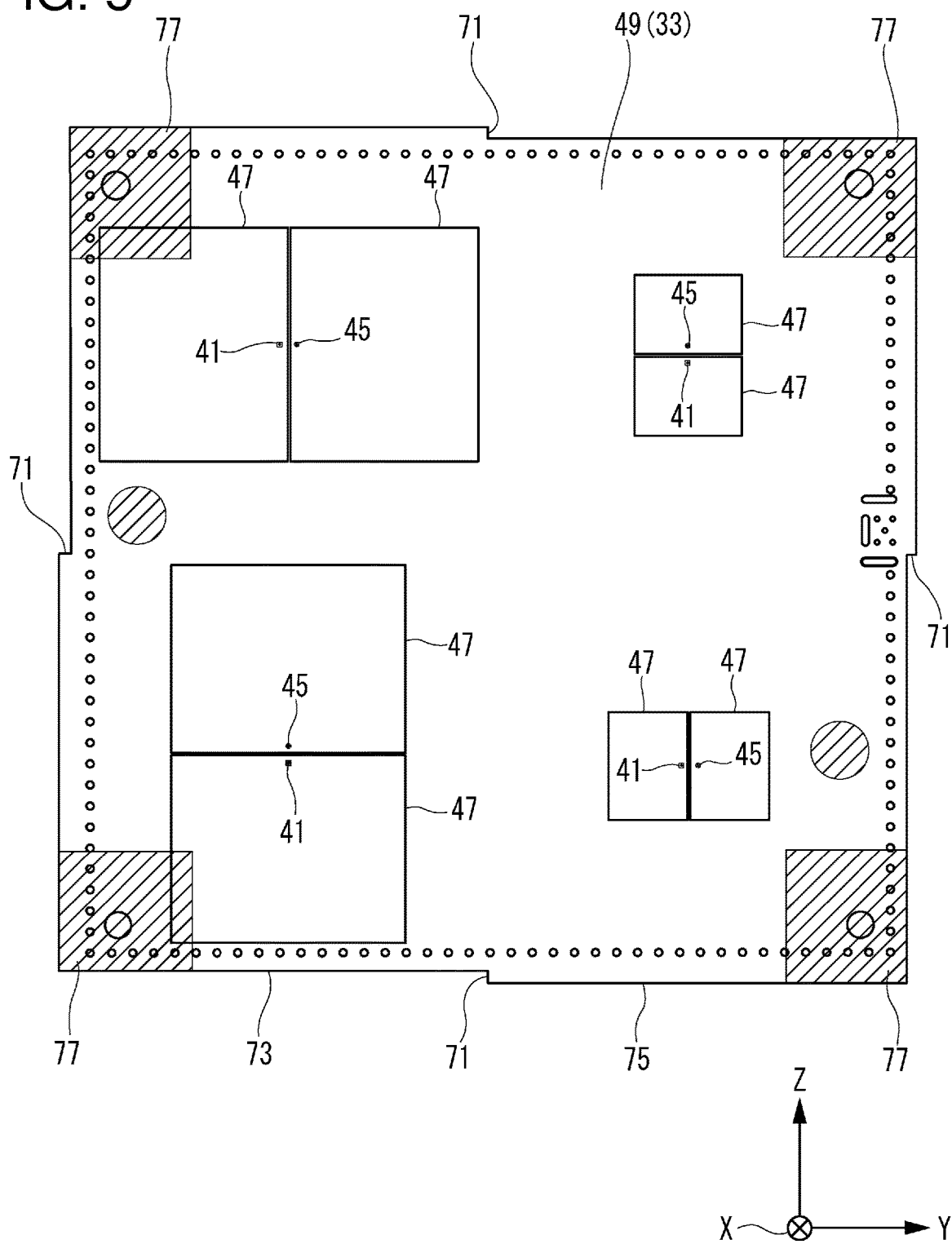
FIG. 5 is a plan view showing an AMC together with a dielectric substrate.

FIG. 5 is a plan view showing the AMC 47 together with the dielectric substrate 49. The AMC 47 is provided on the dielectric substrate 49 corresponding to the antenna conductor of the horizontal polarization antenna 19, the antenna conductor of the vertical polarization antenna 21, the antenna conductor of the horizontal polarization antenna 23 and the antenna conductor of the vertical polarization antenna 25, respectively.

As shown in FIG. 5, each AMC 47 has a different size (area) according to a wavelength of a radio wave received by the horizontal polarization antenna 19 and the vertical polarization antenna 21 (that is, the wavelength of the radio wave in the 2.4 GHz band), and a wavelength of a radio wave received by the horizontal polarization antenna 23 and the vertical polarization antenna 25 (that is, the wavelength of the radio wave in the 5 GHz band). That is, the size (area) of each AMC 47 corresponding to the horizontal polarization antenna 19 and the vertical polarization antenna 21 is larger than the size (area) of each AMC 47 corresponding to the horizontal polarization antenna 23 and the vertical polarization antenna 25. As shown in FIG. 1, the size (area) of each AMC 47 may be the same.

Figure 6:
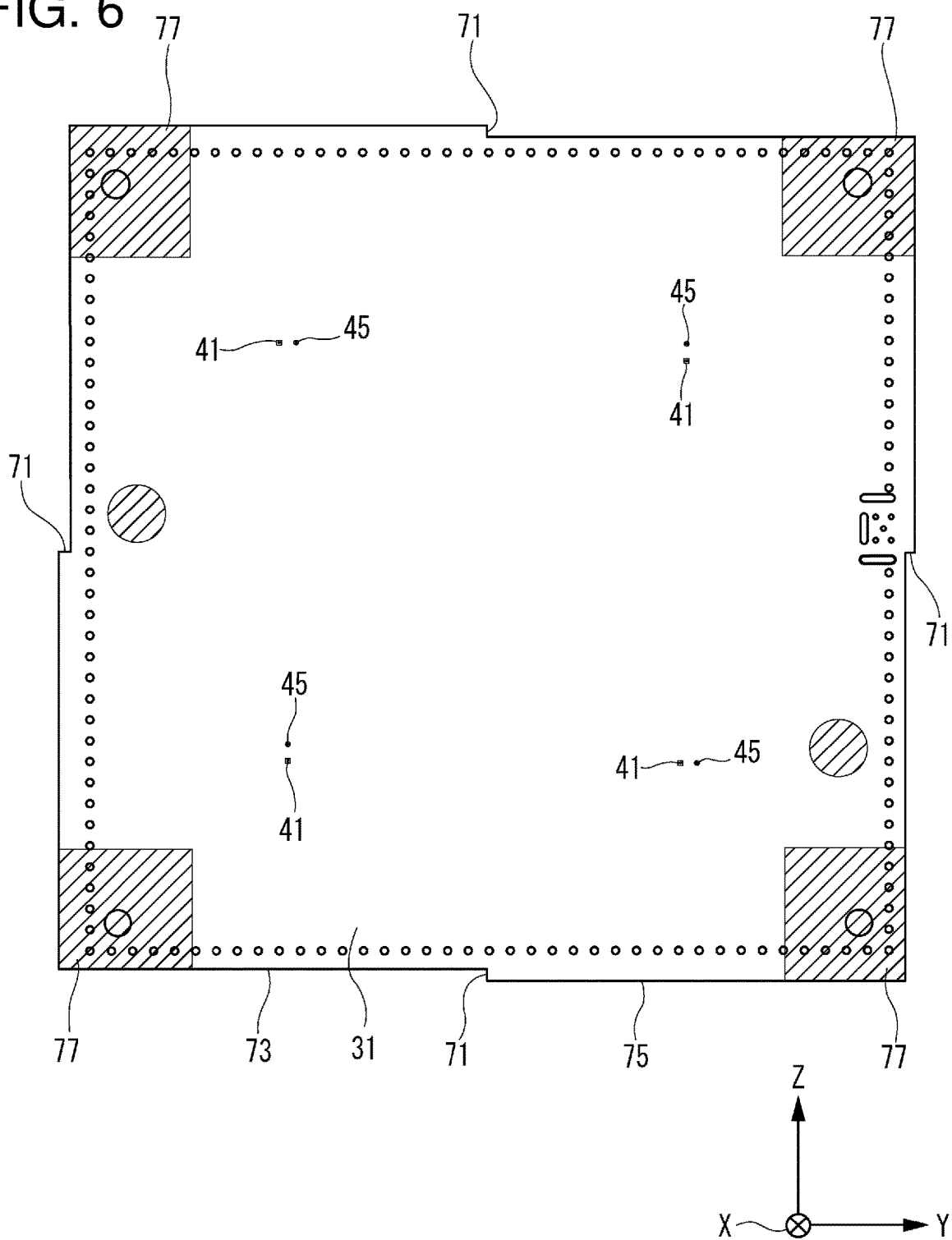
FIG. 6 is a plan view of a shield layer arranged on the dielectric substrate.
Figure 7:
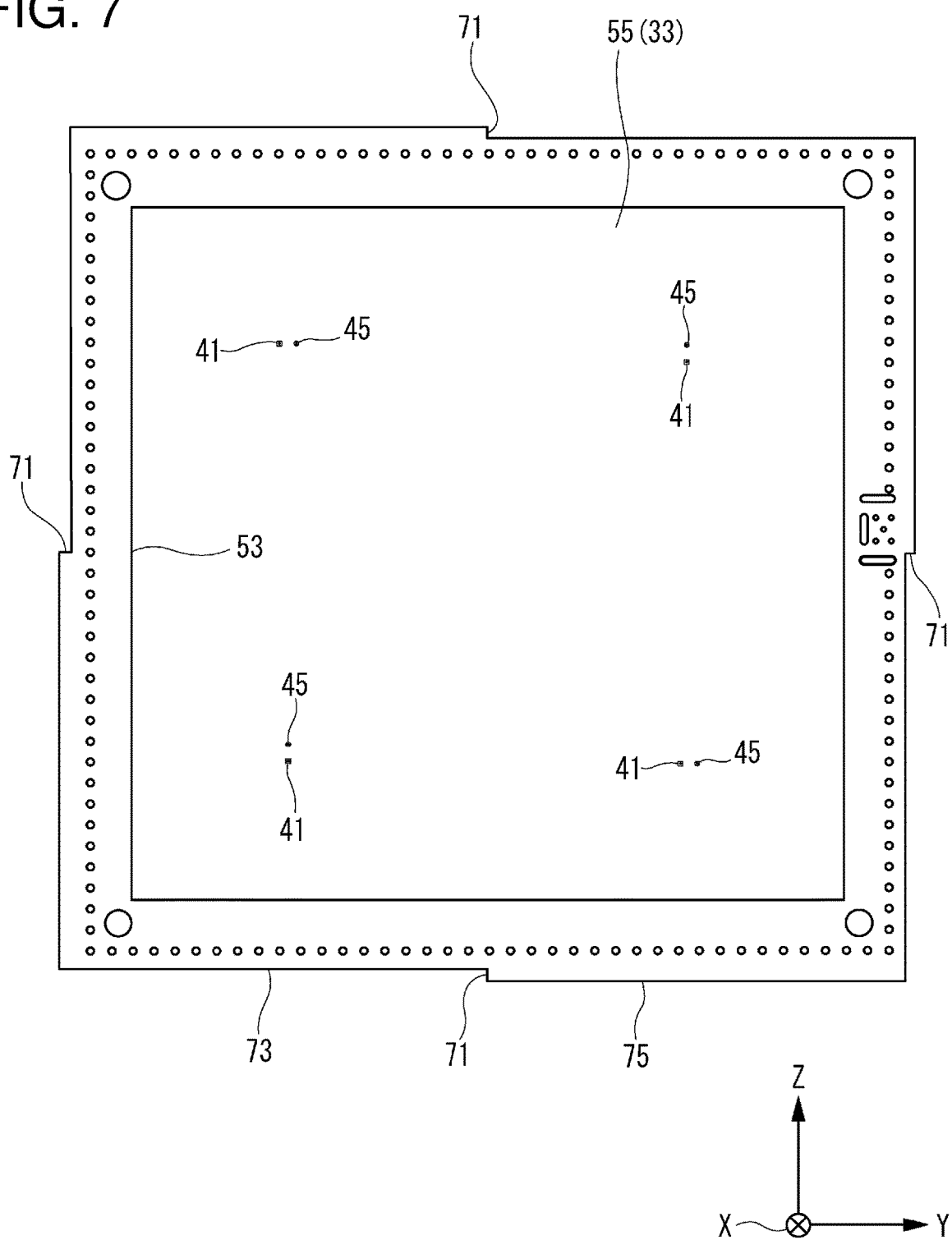
FIG. 7 is a plan view showing a ground conductor together with a dielectric substrate.

FIG. 6 is a plan view of the ground conductor 31 arranged on the dielectric substrate 51. The ground conductor 31 is formed on the entire surface of the dielectric substrate 51. The ground conductor 31 functions as a shield layer which is formed by etching a metal foil such as copper into a predetermined shape. As described above, the shield layer blocks the entry of radio waves from outside the antenna device 11. The ground conductor 31 is conducted to all the grounding via conductors 61.

FIG. 7 is a plan view showing the ground conductor 53 together with the dielectric substrate 55. Around the upper and lower surfaces of the dielectric substrate 55, the frame-shaped ground conductor 53 and the ground conductor 57 are formed. Similarly to the ground conductor 31, the ground conductor 53 and the ground conductor 57 are formed in a frame shape by removing a central portion of a metal foil such as copper by etching or the like. The ground conductor 53 and the ground conductor 57 are conducted to all the grounding via conductors 61.

Figure 8:
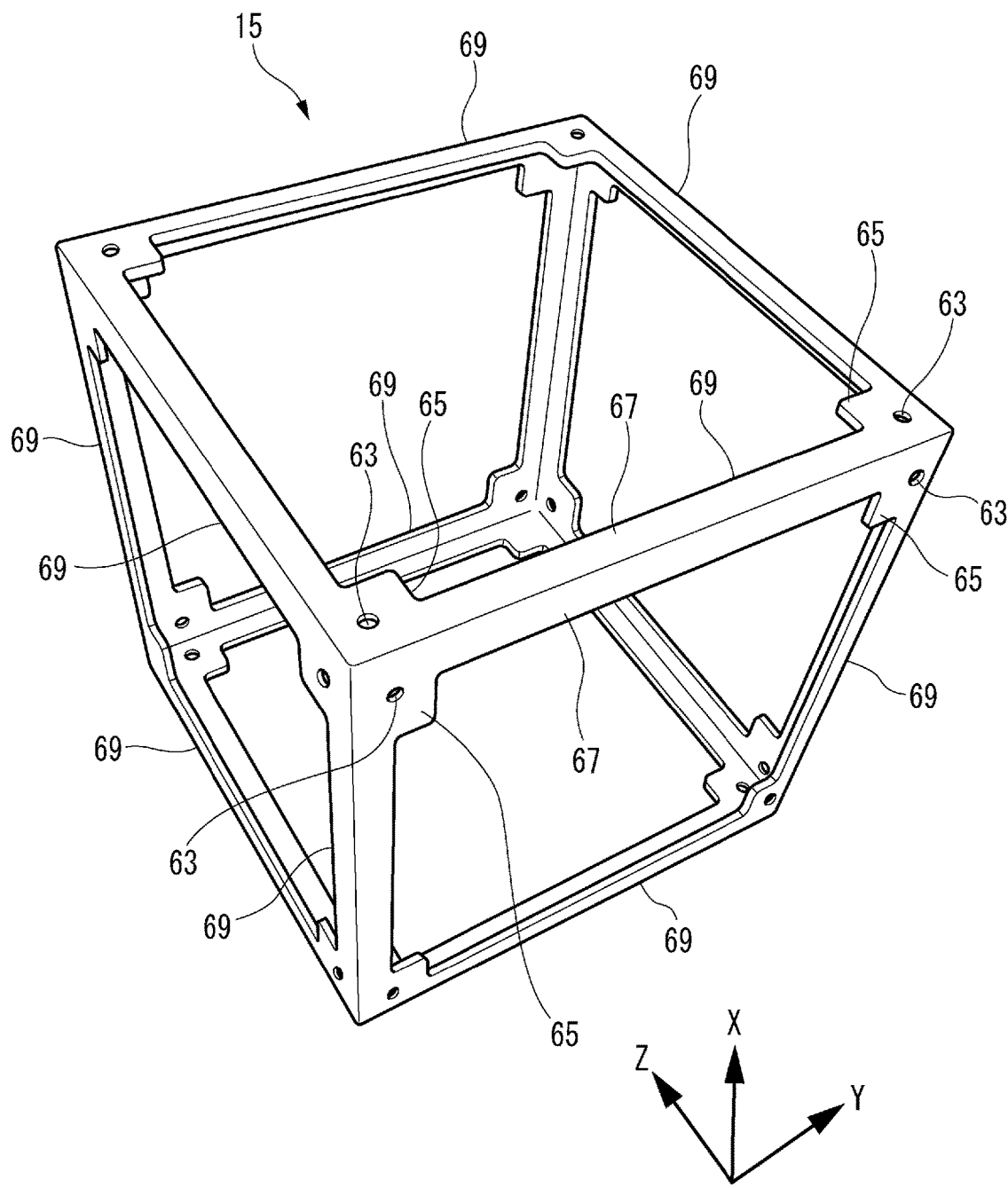
FIG. 8 is a perspective view of the frame body.

FIG. 8 is a perspective view of the frame body 15. In the present embodiment, the joining member configuring the frame body 15 is the angle member 69 having the orthogonal two-surface portion 67, such as steel or aluminum. The orthogonal two-surface portion 67 is a member whose two surface portions are orthogonally and integrally formed. The angle member 69 is formed in a mountain shape having a cross section orthogonal to an extending direction with equal sides. The frame body 15 uses a plurality of (for example, 12) angle members 69 for each side portion. The angle member 69 configures a substantially similar cubic frame (that is, a cubic frame with side portions of adjacent surfaces being connected) in which the antenna device 11 is reduced by joining both ends in the extending direction to each other.

Next, functions and effects of the antenna device 11 according to the present embodiment will be described.

The antenna device 11 according to the present embodiment is used, for example, to visualize the intensity and direction of a radio wave existing in a space where the antenna device 11 is mounted. The radio wave is visualized by field measurement (that is, measurement of the radio wave in the space where the antenna device 11 is mounted) and simulation (that is, a process of visually visualizing the intensity and direction of the radio wave on a graph or the like based on a result of the field measurement). The antenna device 11 is used for the field measurement described above. The antenna device 11 enables a radio wave condition (for example, radio wave intensity, direction of arrival, time variation) to be grasped by the field measurement. By visualizing the radio wave condition using the antenna device 11, it is possible to efficiently analyze the cause and condition of radio wave interference, wireless connection trouble and the like.

In the antenna device 11 according to the present embodiment, each surface of the polyhedron (for example, a cube), which is the housing of the antenna device 11, is formed by the laminated substrate 13. In each laminated substrate 13, at least an antenna conductor (for example, the feeding antenna conductor 27 and the non-feeding antenna conductor 29), an insulating layer (the derivative substrate 33), and a shield layer (the ground conductor 31) are laminated from the upper layer side. In the present specification, the derivative substrate 33 is used as a generic term for the dielectric substrates 37, 49, 51, and 55.

The antenna device 11 is provided with antenna conductors corresponding to the horizontal polarization and vertical polarization of 2.4 GHz band and the horizontal polarization and vertical polarization of 5 GHz band on the respective laminated substrates 13 of the cube, so that radio waves can be received from directions in which the respective laminated substrates 13 can receive. Specifically, by switching the antennas on the respective laminated substrates 13 of the antenna device 11 one by one, it is possible to measure radio waves arriving from six directions.

Figure 9:
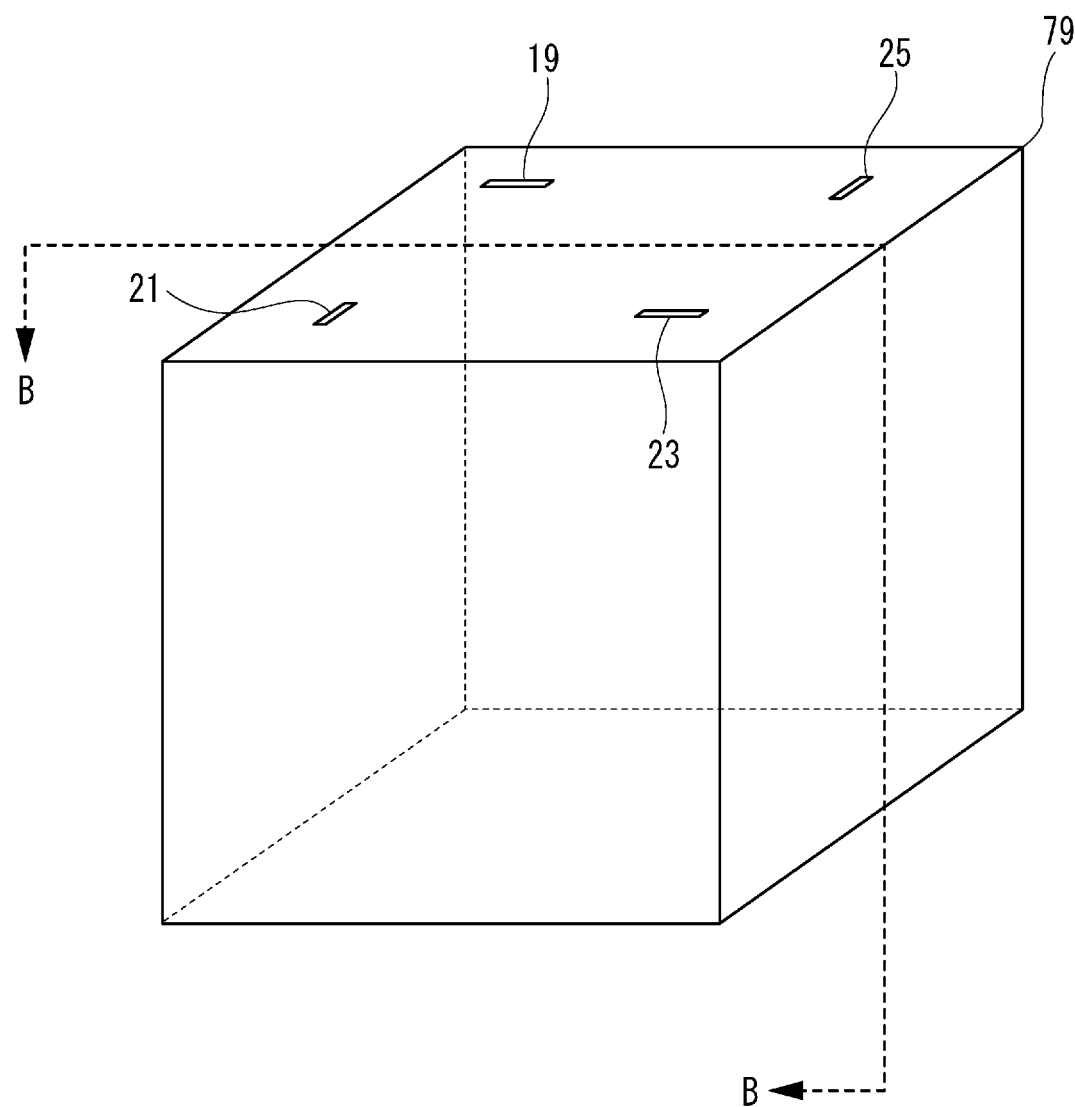
FIG. 9 is a schematic view showing a reference example of a polyhedron without the frame body.
Figure 10:
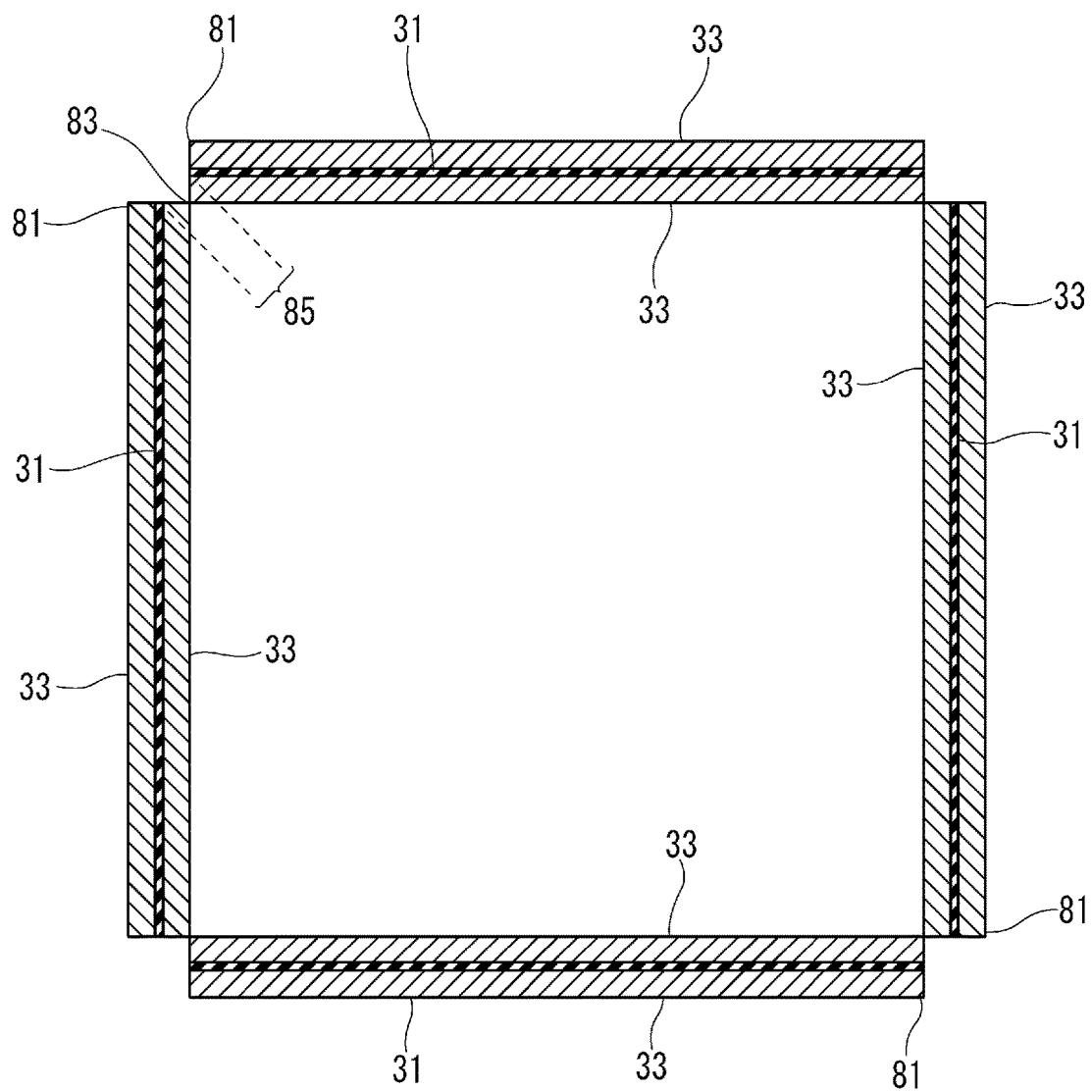
FIG. 10 is sectional view taken along a line B-B of FIG. 9.
Figure 10:
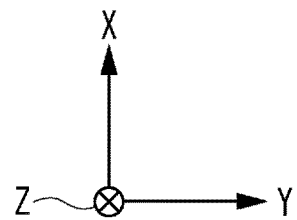

FIG. 9 is a schematic view showing a reference example of a polyhedron without the frame body 15. FIG. 10 is sectional view taken along a line B-B of FIG. 9.

In a cube 79 according to the reference example shown in FIG. 9, the ground conductor 31 is provided on each laminated substrate 81 (see FIG. 10). Between adjacent laminated substrates of the cube 79, edge portions of the laminated substrates 81 are assembled by abutting or fitting (joint 83). Between the adjacent laminated substrates, the ground conductor 31 and the derivative substrate 33 are laminated in the laminated substrate 81, and therefore, the derivative substrates 33 come into contact before the shield layers (that is, the ground conductor 31) contact each other as shown in FIG. 10. As a result, a discontinuous portion 85 of the ground conductor 31 occurs at the joint 83 between the edge portions of the laminated substrates 81.

The discontinuous portion 85 of the ground conductor 31 allows a radio wave to enter the inside of the cube. The radio wave entered the inside of the cube may be diffused and adversely affect a reception state of the antenna provided on other surfaces. In addition, adverse effects due to radio waves entered the inside of the cube may, for example, also affect switches and receiving circuits of other antennas arranged inside the cube in addition to direct effects on other antennas.

Therefore, the antenna device 11 according to the present embodiment includes a plurality of laminated substrates 13 that form surfaces of the cube and in which at least the antenna conductor, the derivative substrate 33, and the ground conductor 31 are laminated from the upper layer side; and the frame body 15 that has conductivity, fixes edge portions along each side of adjacent laminated substrates 13 inside the cube, and has the joining member (for example, the angle member 69) having the intersecting two-surface portion (for example, the orthogonal two-surface portion 67) that conducts with the shield layer (for example, the ground conductor 31).

Figure 11:
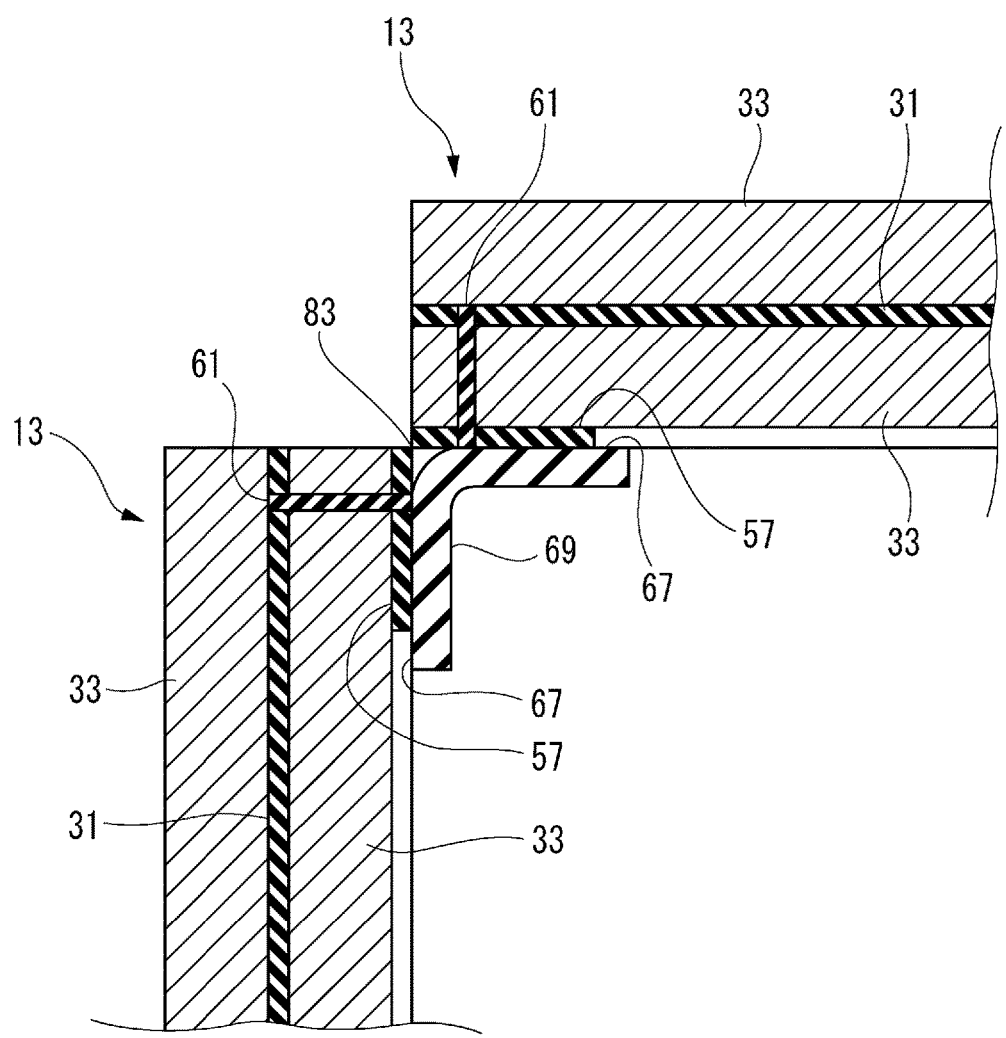
FIG. 11 is a schematic view conceptually showing a shield structure at a joint in the antenna device shown in FIG. 1.
Figure 11:
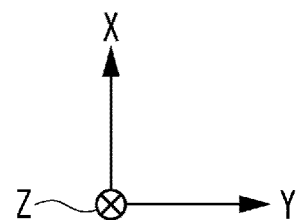

FIG. 11 is a schematic view conceptually showing a shield structure at the joint 83 in the antenna device 11 shown in FIG. 1.

In the antenna device 11, each laminated substrate 13 is fixed to the frame body 15. The frame body 15 forms a mounting frame for the laminated substrate 13 with the angle member 69. The edge portions of the laminated substrate 13 in the cube are fixed to the orthogonal two-surface portion 67 of the angle member 69. The angle member 69 has conductivity, and as shown in FIG. 11, fixes the edge portions of the laminated substrate 13 and conducts with the ground conductor 31 serving as a shield layer via the grounding via conductor 61. That is, the adjacent laminated substrates 13 fixed to the orthogonal two-surface portion 67 of the angle member 69 is grounded at the same potential as that of the frame body 15 by the ground conductors 57 that conduct with the ground conductors 31 via the grounding via conductors 61 coming into contact with the orthogonal two-surface portion 67.

As a result, the discontinuous portion 85 of the ground conductor 31 generated by the joint 83 between the edge portions is connected by the angle member 69, and the entry of radio waves into the cube is prevented. According to the antenna device 11, a radio wave is prevented from entering inside of the cube, so that the direction of arrival of the radio wave can be more accurately measured as compared with a configuration in which a radio wave is allowed to enter.

In addition, according to the antenna device 11, the joining member is the angle member 69 having the orthogonal two-surface portion 67 and made of steel, aluminum or the like.

Therefore, according to the antenna device 11 of the present embodiment, it is possible to prevent an adverse effect that may occur in transmission and reception of a radio wave by an antenna element (antenna conductor) on other surfaces due to a radio wave entering from the joint 83 between surfaces of the housing 17, the housing 17 being formed in a hexahedron (for example, the cube) by a plurality of surfaces on which antenna elements (antenna conductor) are respectively arranged.

In the antenna device 11, the joining member that is a component of the frame body 15 is the angle member 69 having the orthogonal two-surface portion 67. That is, the angle member 69 is, for example, an equilateral mountain-shaped (L-shaped) angle member 69. By using the equilateral mountain-shaped angle member 69 as the joining member in the antenna device 11, the frame body 15 can be manufactured at lower cost and lighter weight.

Further, in the antenna device 11, each of the plurality of surface members (for example, the laminated substrates 13) is formed in a square shape, and the concave portion 73 and the convex portion 75 are formed in each side portion of the laminated substrate 13 in a direction along the side portion with one step portion 71 provided at the center of the side portion as a boundary. The polyhedron is a hexahedron (cube) in which the concave portions 73 and the convex portions 75 of the adjacent laminated substrates are fitted and assembled.

In the antenna device 11, the edge portions of the adjacent laminated substrates are assembled by fitting the concave portions 73 and the convex portions 75 together. Therefore, relative positions of the adjacent laminated substrates in the direction along the side portion are determined by contacting the step portions. Therefore, the positioning when assembling the six laminated substrates 13 to the frame body 15 becomes easier, and the assembling work can be easily performed. Further, the assembling accuracy of the hexahedron can be further improved. Further, the strength of the assembled hexahedron against an external load can be further increased.

Although various embodiments are described above with reference to the drawings, it is needless to say that the present disclosure is not limited to such examples. It will be apparent to those skilled in the art that various alterations, modifications, substitutions, additions, deletions, and equivalents can be conceived within the scope of the claims, and it should be understood that such changes also belong to the technical scope of the present disclosure. Each component in the various embodiments mentioned above may be combined arbitrarily in the range without deviating from the spirit of the invention.

The present application is based on a Japanese patent application (NO. 2017-253890) filed on Dec. 28, 2017, the contents of which are incorporated by reference in this application.

The present disclosure is useful as an antenna device capable of preventing an adverse effect that may occur in transmission and reception of a radio wave by an antenna element on other surfaces due to a radio wave entering from a joint between surfaces of a housing, the housing being formed in a hexahedron by a plurality of surfaces on which antenna elements are respectively arranged.

What is claimed is:

1. An antenna device having a shape of a polyhedron, comprising:
   a plurality of surface members that form surfaces of the polyhedron, and each of which having at least an antenna conductor, an insulating layer, and a shield layer are laminated from an upper layer side; and
   a frame body that has conductivity, fixes edge portions along sides of adjacent surface members inside the polyhedron, and has a joining member having an intersecting two-surface portion that conducts with the shield layer.

2. The antenna device according to claim 1, wherein the joining member is an angle member having orthogonal two-surface portion and is made of steel or aluminum.

3. The antenna device according to claim 1,
   wherein each of the plurality of surface members is formed in a quadrangle shape,
   wherein a concave portion and a convex portion are formed in each side portion of the plurality of surface members in a direction along the each side portion with a step portion provided at a center of the each side portion as a boundary; and
   wherein the polyhedron is a hexahedron in which the concave portions and the convex portions of adjacent surface members are fitted and assembled.

4. The antenna device according to claim 2,
   wherein each of the plurality of surface members is formed in a quadrangle shape,
   wherein a concave portion and a convex portion are formed in each side portion of the plurality of surface members in a direction along the each side portion with a step portion provided at a center of the each side portion as a boundary; and
   wherein the polyhedron is a hexahedron in which the concave portions and the convex portions of adjacent surface members are fitted and assembled.

* * * * *